United States Patent [19]

van der Poel et al.

[11] 4,085,370
[45] Apr. 18, 1978

[54] RADIO RECEIVER HAVING CO-CHANNEL INTERFERENCE OPERATED SQUELCH

[75] Inventors: Johannes van der Poel; Johannes Noordanus, both of Hilversum, Netherlands

[73] Assignee: U.S. Philips Corporation, New York, N.Y.

[21] Appl. No.: 727,900

[22] Filed: Sep. 29, 1976

[30] Foreign Application Priority Data

Feb. 10, 1975 Netherlands .................... 7511580

[51] Int. Cl.² .............................................. H04B 1/10
[52] U.S. Cl. ....................................... 325/348; 325/478
[58] Field of Search ................ 325/348, 478, 480, 482

[56] References Cited

U.S. PATENT DOCUMENTS

| | | | |
|---|---|---|---|
| 3,090,918 | 5/1963 | Arguimbau | 325/348 |
| 3,188,571 | 6/1965 | Michael | 325/348 |
| 3,934,206 | 1/1976 | Holecek | 325/478 |

OTHER PUBLICATIONS

"Active Filters : Lumped, Distributed, Integrated, Digital & Parametric", Lawrence P. Huelsman, 1970, McGraw-Hill, pp. 119-127.

*Primary Examiner*—Robert L. Griffin
*Assistant Examiner*—Marc E. Bookbinder
*Attorney, Agent, or Firm*—Frank R. Trifari; Henry I. Steckler

[57] ABSTRACT

FM-radio receiver having an audio amplifier stage, provided with switching means, and a squelch circuit which is coupled to the output of the receiver demodulator, this squelch circuit comprising two circuits which are constructed in such a manner that one circuit produces at an early stage an output signal when co-channel interference occurs whereas the other circuit produces an output signal which controls said switching means and which occurs only at an impermissible signal/noise ratio and/or an impermissible degree of co-channel interference.

7 Claims, 2 Drawing Figures

RADIO RECEIVER HAVING CO-CHANNEL INTERFERENCE OPERATED SQUELCH

The invention relates to a radio receiver for carrier signals frequency modulated with signals within a speech frequency band, comprising an input stage for said carrier signals, a frequency-transposition stage, a tuned intermediate frequency amplifier and limiting circuit, a frequency discriminator, a switchable audio amplifier, and a reproducing device in cascade in that order, the receiver also including a coupling including a noise selection filter between the discriminator output and a control input of the audio amplifier for blocking transmission through said audio amplifier when the signal transmitted by said filter exceeds a certain value.

Radio receivers of this general type are well-known and are used, for example, in mobile automatic telephone systems.

In view of the size of the area which such a telephone system has to cover and the limited number of channel frequencies available, it is necessary that the same channel frequencies be used more than once within the same system, albeit at locations which are a relatively large distance apart. In spite of very careful planning so that the distances between areas using the same channel frequencies are as large as possible there is still a risk that a radio receiver in the system will not only receive the channel frequency transmitted by a desired station but, owing to, for example, certain atmospheric conditions, it will also receive a modulated or unmodulated carrier, transmitted by an undesired, remote transmitting station operating on substantially the same channel frequency.

This particular type of interference, which is known as co-channel interference in the literature, may occur in such a mobile automatic telephone system at any moment and disturb an existing connection. Depending on the extent of the interference, it may even happen that a conversation which is not intended for the disturbed radio receiver will be received audibly thereby, long before the audio amplifier blocking circuit which is mainly responsive to the internal receiver noise is energized. Such known radio receivers are therefore not very suitable for use in a public mobile telephone system as it is difficult to satisfy the stringent secrecy requirements of such a system therewith.

It is an object of the invention to mitigate these drawbacks.

The invention provides a radio receiver for carrier signals frequency-modulated with signals within a speech frequency band, comprising an input stage for said carrier signals, a frequency-transposition stage, a tuned intermediate-frequency amplifier and limiting circuit, a frequency discriminator, a switchable audio amplifier, and a reproducing device in cascade in that order, the receiver also including a noise selection filter having a pass characteristic with upper and lower frequency limits both of which lie between the upper limit of the speech frequency band and a frequency numerically equal to half the frequency difference between the limits of the pass characteristic of the intermediate frequency amplifier and limiting circuit, which filter is included in a coupling between the discriminator output and inputs of first and second voltage threshold responsive devices which are constructed to respond to first and second voltage thresholds respectively being exceeded at the inputs thereof, both of said thresholds lying above the noise which will be fed in operation by the noise filter to the input of the corresponding threshold device when the receiver is limiting and co-channel interference is absent, and below the noise which will be fed in operation by the noise filter to the corresponding threshold device when the receiver is well out of limiting, the second threshold being higher than the first and the output of the second voltage threshold responsive device being coupled to a control input of the audio amplifier for blocking transmission through said audio amplifier when the second threshold is exceeded at the input of said second threshold responsive device.

With such a receiver it is possible for example, to use the output signal of the first voltage threshold responsive device to cause timely measures to guarantee the required secrecy to be taken at an early stage of co-channel interference. Thus, for example, this output signal can be fed as a starting signal to an automatic channel selection device in order to divert to a free and undisturbed channel in a timely manner.

An embodiment of the invention will be described, by way of example, with reference to the accompanying diagrammatic drawing in which.

Figure 1:
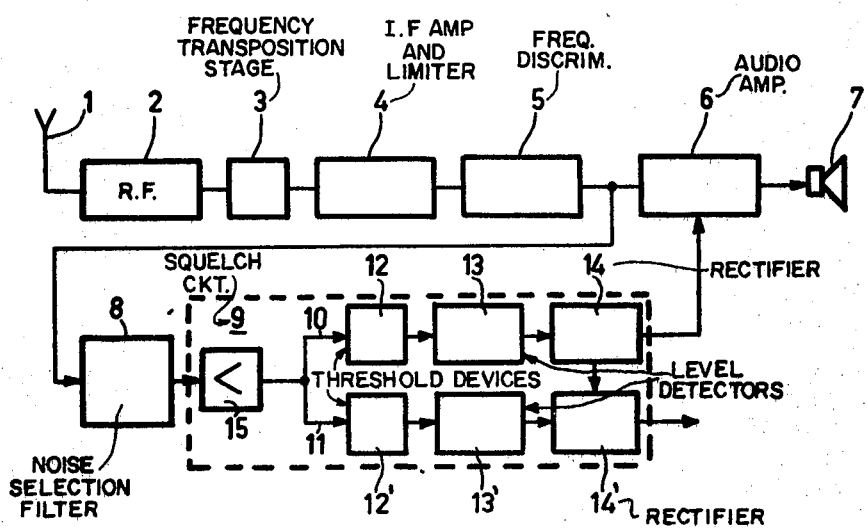
FIG. 1 is a block diagram of a radio receiver.

FIG. 1 shows a radio receiver having an aerial 1 from which the signals received are fed to a radio frequency input stage 2. Stage 2 selects signals from a transmitter (not shown) which transmits a carrier signal frequency-modulated with signals within a speech frequency band, which carrier itself lies within a given frequency band, and feeds them, after amplification, to a frequency transposition stage 3 which changes their frequency to an intermediate frequency. The intermediate frequency signal is amplified and limited in amplitude to a tuned intermediate frequency amplifier and limiting device 4 which may consist of several stages. The modulation is derived from the amplified and limited intermediate frequency signal, by means of a frequency discriminator 5. The audio frequency signal appearing at the output of discriminator 5 is applied to a reproducing device 7 via an audio amplifier stage 6. This audio amplifier stage includes switching means (not shown) for stopping transmission through the stage. The audio frequency signal occurring at the output of discriminator 5 is also fed, through a noise selection filter 8, to a squelch circuit 9 which produces an output signal, when the received noise and/or co-channel interference exceeds a given value. This output signal is fed as a control signal to the switching means of the audio amplifier stage 6 to interrupt transmission therethrough.

In order to obtain early warning of when co-channel interference is occurring, the noise selection filter 8 has passband limits both of which lie between the upper frequency limit of the said speech frequency band, and a frequency numerically equal to half the frequency difference between the limits of the pass characteristic of the intermediate frequency amplifier and limiting device 4. The squelch circuit 9 comprises two circuits 10,11 which each contain, in this sequence, a threshold device 12,12′, a voltage level detector 13,13′ and a rectifier 14,14′. The two circuits 10 and 11 are both fed with the output of the noise selection filter 8. The threshold values of the threshold devices 12 and 12′ are chosen to be different and such that the one in circuit 11 has the lower value. Both lie above the noise fed in operation by filter 8 to the input of the corresponding device 12 or 12' when the receiver is limiting and co-channel interference is absent, and below the noise fed thereto by filter 8 when the receiver is well out of limiting. The output of the circuit 10 including the device 12 having the higher threshold value is fed as the control signal to the switching means of the audio amplifier stage 6.

In practice, with a speech frequency band extending up to 3 kHz, the noise selection filter 8 may be constituted by an L-C band-pass filter having a centre frequency of 6 kHz and a quality factor Q=18.5 if the IF amplifier and limiting circuit 6 has a centre frequency of, for example, 21.5 MHz and a bandwidth of 15 kHz. The inductance L of this filter may be realised by means of a gyrator having a capacitor connected across one port. After amplification in an operational amplifier 15 the output signal of noise selection filter 8 is applied to the two threshold devices 12,12' which may be constructed in known manner from resistors and diodes in such a way that their threshold values can be adjusted by means of potentiometers. The voltage level detectors 13 and 13' connected to the outputs of these threshold devices are preferably each formed by a Schmitt trigger circuit, the output of which is connected to the associated rectifier 14 or 14'.

The noise produced by the receiver itself will in general have a different character than co-channel interference produced by an unwanted transmitter. As is known, the various components of noise have a random distribution so that in the time domain the noise power will be substantially uniformly distributed over the noise band. The higher order intermodulation products which are produced at the output of discriminator 5 owing to an unwanted carrier being received simultaneously with a wanted one have, in contrast, a more discrete character and appear to occur mainly in a narrow band located above the audio band.

Owing to this difference in character the co-channel interference power does not vary substantially with the input signal level to the receiver and only to a limited degree with the type of modulation on both carriers, whereas as is well-known the noise power at the discriminator output varies considerably with the input signal level to the receiver.

Use of a sharp noise selection filter 8 which reacts to frequencies located above the normal speech frequency band (0.3 – 3 kHz) but lower than half the difference between the band limits of the IF amplifier enables a clear indication to be obtained regarding the noise and co-channel interference situation at the input of the receiver.

Figure 2:
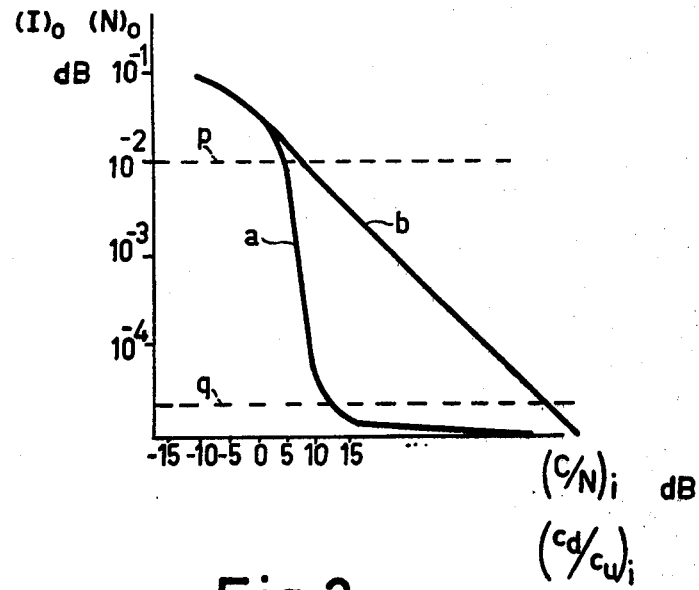
FIG. 2 shows two characteristics for explaining the operation of the radio receiver of FIG. 1.

In this respect, reference may be made to the illustrative curves $a$ and $b$ shown in FIG. 2, curve $a$ showing the variation of the total noise power $(N)_o$ which may be obtained at the output of the noise selection filter 8 as a function of the ratio $(C/N)_i$ of the amplitude of the desired carrier to the amplitude of the internal noise generated in the receiver, transformed to the receiver input, and curve $b$ showing the variation of the co-channel interference power $(I)_o$ which may be obtained at the output of the noise selection filter 8 as a function of the power ratio $(C_d/C_u)_i$ between desired and undesired carrier at the input of the receiver. The slope of the curve $b$ is constant, its position being determined by the type of modulation and the amount of the carrier off-set: if there should be no modulation of one of the carriers the curve will be shifted slightly in the direction of the vertical axis.

FIG. 2 also shows the threshold values $p$ and $q$ to which the threshold devices 12 and 12' respectively have been adjusted, transformed to the input of operational amplifier 9. It will be seen that the noise power $(N)_o$ occurring at the output of the noise selection filter 8 will not exceed the lower threshold $q$ as long as a carrier/noise ratio $(C/N)_i$ of at least 10 dB is produced at the input of the receiver. If it is assumed that a good carrier noise ratio is present, then even if only a sight amount of co-channel interference also appears, the co-channel interference power $(I)_o$ occurring at the output of the noise selection filter 8 will soon reach a value which exceeds the lower threshold $q$ (since $I_o$ is independent of the input level of the receiver) with the result that an output signal appears at the output of the circuit 11. This output signal may, for example, be used as an early warning that the existing, still usable radio connection is threatened by co-channel interference.

The higher threshold $p$ is exceeded when the carrier/noise ratio $(C/N)_i$ decreases to just less than 10 dB and/or when the desired/undesired carrier ratio $(C_d/C_u)_i$ does the same, resulting in the circuit 10 of the circuit 9 producing an output signal which is fed as a control signal to the switching means of the audio amplifier stage 6 so as to interrupt transmission therethrough.

When the higher threshold $p$ is exceeded the lower threshold $q$ is of course also exceeded so that both channels 10 and 11 then produce an output signal. If desired, the circuit 9 may be modified in a manner such that the circuit 11 is blocked as soon as the circuit 10 produces an output signal. This may for example be realised by providing the rectifier 14' with a normally conductive input gate through which the output signal of the voltage level detector 13' is applied to it, which gate is blocked by the output signal of the circuit 10 so that only the circuit 10 produces an output voltage when this occurs.

What is claimed is:

1. A radio receiver for carrier signals frequency-modulated with signals within a speech frequency band, comprising an input means for receiving said carrier signals, a frequency-transposition stage coupled to said means, a tuned intermediate frequency amplifier and limiting circuit coupled to said transposition stage and having a given passband characteristic, a frequency discriminator coupled to said intermediate frequency amplifier and limiting circuit, a switchable audio amplifier coupled to said discriminator and having a control input means, a noise selection band pass filter coupled to said discriminator having a sharp pass band characteristic with upper and lower frequency limits both of which lie between the upper limit of the speech frequency band and a frequency numerically equal to half the frequency difference between the limits of the pass band characteristic of the intermediate frequency amplifier and limiting circuit, first and second voltage threshold responsive device means coupled to said filter for responding when first and second voltage thresholds respectively are exceeded at the inputs thereof, both of said thresholds lying above the noise which will be inherently applied in operation by the noise filter to the inputs of said first and second threshold responsive device means when the receiver is limiting and co-channel interference is absent, and below the noise which will be inherently applied in operation by the noise filter to the inputs of said first and second threshold responsive device means when the receiver is well out of limiting, the second threshold being higher than the first and the output of the second voltage threshold responsive device being coupled to said control input means of the audio amplifier for blocking transmission through said audio amplifier when the second threshold is exceeded at the input of said second threshold responsive device said first threshold device responsive means having output means for providing an early warning signal of co-channel interference.

2. A receiver as claimed in claim 1, wherein each voltage threshold responsive device means comprises a threshold device and a voltage level detector coupled in cascade.

3. A receiver as claimed in claim 1, wherein each voltage threshold responsive device means comprises a rectifier.

4. A receiver as claimed in claim 1, wherein the filter has an inductive component comprising a gyrator having a capacitor connected across a first port thereof.

5. A receiver as claimed in claim 1, further including means for disabling the circuit containing the first voltage threshold responsive device means when the second voltage threshold is exceeded at the input of the second voltage threshold responsive device means.

6. A receiver as claimed in claim 5, wherein said disabling means comprises a gate included in the output of the first voltage threshold responsive device means, said gate having a blocking signal input which is coupled to the output of the second voltage threshold responsive device means.

7. A communication system comprising a receiver as claimed in claim 1 and a transmitter for a carrier signal frequency-modulated with signals within said speech frequency band.

* * * * *